(12) United States Patent
Harris et al.

(10) Patent No.: US 10,541,347 B2
(45) Date of Patent: Jan. 21, 2020

(54) COMPOSITE NANOPARTICLE AND PHOTODETECTOR COMPRISING THE NANOPARTICLE

(71) Applicant: Nokia Technologies Oy, Espoo (FI)

(72) Inventors: Nadine Harris, Cambridge (GB); Richard White, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/068,704

(22) PCT Filed: Dec. 28, 2016

(86) PCT No.: PCT/FI2016/050926
§ 371 (c)(1),
(2) Date: Jul. 9, 2018

(87) PCT Pub. No.: WO2017/121922
PCT Pub. Date: Jul. 20, 2017

(65) Prior Publication Data
US 2019/0027631 A1    Jan. 24, 2019

(30) Foreign Application Priority Data

Jan. 11, 2016   (EP) ..................................... 16150795

(51) Int. Cl.
*H01L 29/06*   (2006.01)
*H01L 31/00*   (2006.01)
(Continued)

(52) U.S. Cl.
CPC .... *H01L 31/112* (2013.01); *H01L 31/035218* (2013.01); *H01L 31/035236* (2013.01)

(58) Field of Classification Search
None
See application file for complete search history.

(56) References Cited

U.S. PATENT DOCUMENTS 6,660,381 B2    12/2003   Halas et al.
7,790,066 B2     9/2010   Wang et al.
(Continued)

FOREIGN PATENT DOCUMENTS

WO    1999/046351 A1    9/1999

OTHER PUBLICATIONS

Cademartiri et al., "Size-Dependent Extinction Coefficients of PbS Quantum Dots", Journal of the American Chemical Sociey, vol. 128, No. 31, 2006, pp. 10337-10346.
(Continued)

*Primary Examiner* — Calvin Y Choi
(74) *Attorney, Agent, or Firm* — Harrington & Smith

(57) ABSTRACT

A composite nanoparticle (1) comprises an inner core (3) made of a transparent dielectric material, a first coating layer (5) made of a plasmonic material which overlays the inner core (3) and a second coating layer (7) made of a semiconductor material overlaying the first coating layer (5). Incident light is absorbed by generating surface plasmons at a boundary (4) between the inner core (3) and the first coating layer (5) and at a boundary (6) between the first coating layer (5) and the second coating layer (7) in order to increase the light absorption and thus the exciton generation by the second coating layer (7). The structure of composite particle (1) also allows for tuning of the resonance of the surface plasmons which tunes the frequency of light, or other electromagnetic radiation, that is detected. A photodetector for detecting the absorbed light comprises a channel (25) which is a layer of a two-dimensional material between a source electrode (23) and a drain electrode (24), and a layer (27) of a plurality of composite particles (1). The layer (27) acts as a photogate of the field effect transistor (21).

19 Claims, 3 Drawing Sheets

(51) Int. Cl.
    *H01L 31/112*    (2006.01)
    *H01L 31/0352*   (2006.01)

(56) References Cited

U.S. PATENT DOCUMENTS

| | | | |
|---|---|---|---|
| 8,017,235 | B2 | 9/2011 | Nakamura et al. |
| 8,598,567 | B2 | 12/2013 | Huang et al. |
| 2001/0002275 | A1 | 5/2001 | Oldenburg et al. |
| 2008/0241262 | A1 | 10/2008 | Lee et al. |
| 2014/0299741 | A1 | 10/2014 | Colli |

OTHER PUBLICATIONS

Rakovich et al., "Plasmonic Control of Radiative Properties of Semiconductor Quantum Dots Coupled to Plasmonic Ring Cavities", ACS Nano, vol. 9, No. 3, 2015, pp. 2648-2658.

Song et al., "Composite Silica Coated Gold Nanosphere and Quantum Dots Nanoparticles for X-ray CT and Fluorescence Bimodal Imaging", Dalton Transactions, vol. 44, No. 25, 2015, pp. 11314-11320.

Lee et al., "Au—PbS Core-Shell Nanocrystals: Plasmonic Absorption Enhancement and Electrical Doping via Intra-particle Charge Transfer", Journal of the American Chemical Society, vol. 130, No. 30, 2008, pp. 9673-9675.

Brown et al., "Plasmonic Dye-Sensitized Solar Cells Using Core-Shell Metal-Insulator Nanoparticles", Nano Letters, vol. 11, No. 2, 2011, pp. 438-445.

Harris et al., "Optimization of Plasmonic Heating by Gold Nanospheres and Nanoshells", The Journal of Physical Chemistry B, vol. 110, No. 22, 2006, 7 pages.

Extended European Search Report received for corresponding European Patent Application No. 16150795.9, dated Aug. 22, 2016, 16 pages.

Khosroabadi et al., "Nanoimprinted Hybrid Metal-Semiconductor Plasmonic Multilayers with Controlled Surface Nano Architecture for Applications in NIR Detectors", Materials, vol. 8, No. 8, 2015, pp. 5028-5047.

Okasha et al., "Weak Exciton-Plasmon and Exciton-Phonon Coupling in Chemically Synthesized Ag/CdSe Metal/Semiconductor Hybrid Nanocomposite", Physica E: Low-dimensional Systems and Nanostructures, vol. 44, No. 10, Jul. 2012, pp. 2094-2098.

Tanabe, "Field Enhancement around Metal Nanoparticles and Nanoshells: A Systematic Investigation", Journal of Physical Chemistry, vol. 112, No. 40, 2008, pp. 15721-15728.

Yong et al., "Synthesis and Plasmonic Properties of Silver and Gold Nanoshells on Polystyrene Cores of Different Size and of Gold-Silver Core-Shell Nanostructures", Colloids and Surfaces A: Physicochemical and Engineering Aspects, vol. 290, No. 1-3, 2006, pp. 89-105.

Konstantatos et al., "Hybrid Graphene-Quantum Dot Phototransistors with Ultrahigh Gain", Nature Nanotechnology, vol. 7, Jun. 2012, pp. 363-368.

Jiang et al., "Metal/Semiconductor Hybrid Nanostructures for Plasmon-Enhanced Applications", Advanced Materials, vol. 26, No. 31, Aug. 20, 2014, pp. 5274-5309.

International Search Report and Written Opinion received for corresponding Patent Cooperation Treaty Application No. PCT/FI2016/050926, dated Apr. 6, 2017, 20 pages.

COMPOSITE NANOPARTICLE AND PHOTODETECTOR COMPRISING THE NANOPARTICLE

RELATED APPLICATION

This application was originally filed as PCT Application No. PCT/FI2016/050926 filed Dec. 28, 2016, which claims priority benefit from EP Patent Application No. 16150795.9 filed Jan. 11, 2016.

TECHNOLOGICAL FIELD

Examples of the disclosure relate to a composite particle, apparatus comprising a composite particle and method of producing a composite particle and apparatus. In particular, they relate to a composite particle, apparatus comprising a composite particle and method of producing a composite particle and apparatus which enable electromagnetic radiation to be detected.

BACKGROUND

Apparatus for detecting electromagnetic radiation such as light is known. It is useful to improve the efficiency of such apparatus. It may also be useful to tune the wavelengths of the light, or other electromagnetic radiation that is detected.

BRIEF SUMMARY

According to various, but not necessarily all, examples of the disclosure there is provided a composite particle comprising: an inner core comprising a dielectric material; a first coating layer provided overlaying the inner core; a second coating layer provided overlaying the first coating layer where the second coating layer comprises a semi-conductor material; and wherein the first coating layer comprises a plasmonic material configured to enable surface plasmons to be generated at a boundary between the inner core and the first coating layer and a boundary between the first coating layer and the second coating layer.

In some examples the thickness of the first coating layer may enable coupling between surface plasmons generated at the boundary between the inner core and the first coating layer and surface plasmons generated at the boundary between the first coating layer and the second coating layer.

In some examples the thickness of the first coating layer may be configured to tune the coupling of the surface plasmons so that the frequency of light absorbed by the first coating layer corresponds to the frequency of light absorbed by the second coating layer.

In some examples the second coating layer may form the outer surface of the composite particle.

In some examples the second coating layer may be configured to generate excitons in response to incident light.

In some examples the inner core may comprise a material which does not absorb incident light.

In some examples the inner core may comprise polystyrene.

In some examples the first coating layer may comprise a metal.

In some examples the composite particle may be spherical.

According to various, but not necessarily all, examples of the disclosure there is provided an apparatus comprising at least one composite particle as described above and a layer of two dimensional material wherein the one or more composite particles are coupled to the layer of two dimensional material to enable absorption of light by the composite particle to be detected by the layer of two dimensional material.

In some examples the two dimensional material may be configured to detect a change in the electric field of the composite particle caused by the absorption of light.

In some examples the two dimensional material may form a channel within a field effect transistor.

In some examples the two dimensional material may comprise graphene.

According to various, but not necessarily all, examples of the disclosure there is provided a photodetector comprising at least one composite particle as described above.

According to various, but not necessarily all, examples of the disclosure there is provided a photodetector comprising an apparatus as described above.

According to various, but not necessarily all, examples of the disclosure there is provided a method comprising: forming an inner core comprising a dielectric material; forming a first coating layer overlaying the inner core; forming a second coating layer overlaying the first coating layer where the second coating layer comprises a semi-conductor material; and wherein the first coating layer comprises a plasmonic material configured to enable surface plasmons to be generated at a boundary between the inner core and the first coating layer and a boundary between the first coating layer and the second coating layer and wherein the inner core, first coating layer and second coating layer form a composite particle.

In some examples the thickness of the first coating layer may enable coupling between surface plasmons generated at the boundary between the inner core and the first coating layer and surface plasmons generated at the boundary between the first coating layer and the second coating layer.

In some examples the thickness of the first coating layer may be configured to tune the coupling of the surface plasmons so that the frequency of light absorbed by the first coating layer corresponds to the frequency of light absorbed by the second coating layer.

In some examples the second coating layer may form the outer surface of the composite particle.

In some examples the second coating layer may be configured to generate excitons in response to incident light.

In some examples the inner core may comprise a material which does not absorb incident light.

In some examples the inner core may comprise polystyrene.

In some examples the first coating layer may comprise a metal.

In some examples the inner core, first coating layer and second coating layer may form a spherical composite particle.

In some examples the method may comprise coupling at least one composite particle as described above to a layer of two dimensional material to enable absorption of light by the composite particle to be detected by the layer of two dimensional material.

In some examples the method may comprise configuring the two dimensional material to detect a change in the electric field of the composite particle caused by the absorption of light.

In some examples the two dimensional material may be configured to form a channel within a field effect transistor.

In some examples the two dimensional material comprises graphene.

According to various, but not necessarily all, examples of the disclosure, there may be provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

Figure 1:
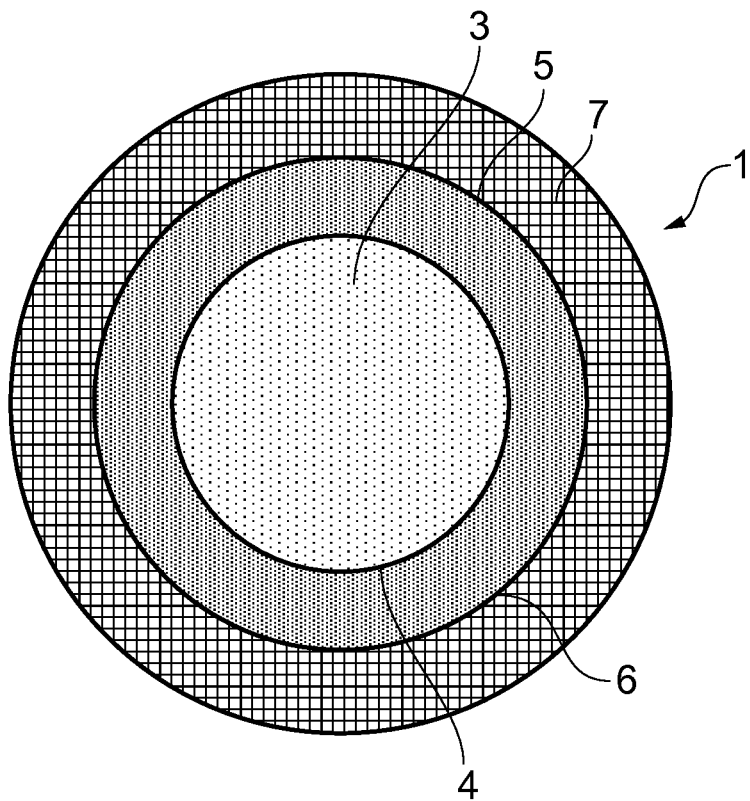
FIG. 1 illustrates a composite particle.

The Figures illustrate a composite particle 1 comprising: an inner core 3 comprising a dielectric material; a first coating layer 5 provided overlaying the inner core 3; a second coating layer 7 provided overlaying the first coating layer 5 where the second coating layer 7 comprises a semi-conductor material; and wherein the first coating layer 5 comprises a plasmonic material configured to enable surface plasmons to be generated at a boundary 4 between the inner core 3 and the first coating layer 5 and a boundary 6 between the first coating layer 5 and the second coating layer 7.

The composite particle 1 may be for detecting light or other electromagnetic radiation. The composite particle 1 may be used within photodetector devices, such as field effect transistors, to provide an electrical output signal indicative of the light or other electromagnetic radiation detected by the composite particle.

FIG. 1 illustrates a composite particle 1 according to examples of the disclosure. The composite particle 1 comprises an inner core 3, a first coating layer 5 and a second coating layer 7.

The composite particle 1 may be a nanoparticle or quantum dot. The composite particle 1 may have a size of the order of 10 nm. The dimensions of the composite particle 1 that are used may depend on the wavelength of light, or other electromagnetic radiation, that is to be detected. The dimensions of the composite particle 1 may depend on the dimensions of the respective layers within the composite particle 1.

The inner core 3 comprises the centre of the composite particle 1. The inner core 3 may provide a central solid nucleus for the composite particle 1. The inner core 3 may comprise a dielectric material. In some examples the inner core 3 may comprise a material which does not absorb light. The inner core 3 may comprise polystyrene or any other suitable material.

The first coating layer 5 may be provided overlaying the inner core 3. The first coating layer 5 may be provided directly overlaying the inner core 3 so that there are no intervening components or layers between the inner core 3 and the first coating layer 5. A boundary 4 is provided between the inner core 3 and the first coating layer 5.

The first coating layer 5 may comprise a plasmonic material. The plasmonic material may comprise any material which may create surface plasmons when incident light, or other electromagnetic radiation, is absorbed. The plasmonic material may comprise a metal such as gold, silver, nickel, platinum or any other suitable material.

The first coating layer 5 may be arranged to increase the absorption of light by the second coating layer 7.

The material that is chosen for use as the first coating layer 5 may depend on the wavelength of the light or other electromagnetic radiation that is to be detected.

The second coating layer 7 may be provided overlaying the first coating layer 5. The second coating layer 7 may be provided directly overlaying the first coating layer 5 so that there are no intervening components or layers between the first coating layer 5 and the second coating layer 7 and a boundary 6 is created between the first coating layer 5 and the second coating layer 7.

The second coating layer 7 may provide the outer surface of the composite particle 1. The second coating layer 7 may be configured so that excitons created within the second coating layer 7 and/or other changes in the electric field of the composite particle 1 can be detected by a two dimensional material.

In some examples the second coating layer 7 may comprise a semiconducting material. The semiconducting material could comprise PbS, CdS, CdSe, Ge, ZnO, ZnS or any other suitable material. The material that is chosen for use as the second coating layer 7 may depend on the wavelength of the light or other electromagnetic radiation that is to be detected.

In the example of FIG. 1 the composite particle 1 is spherical. It is to be appreciated that other shaped particles may be used in other examples of the disclosure. For instance the composite particle 1 could be an elongate rod or any other suitable shape. The shape and size of the composite particle 1 could be chosen to tune the wavelength of light, or other electromagnetic radiation, that is absorbed by the composite particle 1.

The composite particle 1 may be configured to absorb light, or other electromagnetic radiation, which is incident on the composite particle 1. The composite particle 1 absorbs light using two different mechanisms.

The second coating layer 7 absorbs light by exciton creation. The second coating layer 7 comprises a semiconducting material which has a band gap between the valence band and the conducting band. If the light which is incident on the composite particle 1 has sufficient energy an electron will be excited within the second coating layer 7 from the valence band to the conduction band. This creates an exciton comprising an electron-hole pair.

The second coating layer 7 may be thin so that any excitons generated can be detected by a transistor, or other suitable device, before the exciton recombines. If the thickness of the second coating layer 7 is increased this may increase the number of excitons created but the excitons may recombine within the second coating layer 7 before they can be detected.

In some examples of the disclosure the second coating layer 7 may be several nanometers thick. The second coating layer 7 may be less than 5 nm thick.

The composite particle 1 may also absorb light by the excitation of surface plasmons within the first coating layer 5. The surface plasmons are created by the interaction between the electromagnetic field of the incident light and the free electrons within the plasmonic material.

The excitation of localized surface plasmons by incident light, or other electromagnetic radiation, results in strong light scattering by the composite particle 1, the appearance of intense surface plasmon absorption bands and an enhancement of the local electromagnetic fields of the composite particle 1. A localized surface plasmon resonance is generated when the wavelength of the incident light on the composite particle 1 is in resonance with an eigenmode of the surface plasmon resonance for the composite particle 1. From Mie scattering theory, the resonance condition for the extinction cross-section for an incident plane wave on a nanoparticle comprising a material, such as metal, is satisfied when $$\mathfrak{R}[\varepsilon_{metal}(\lambda)]+\chi\varepsilon_{diel}=0$$

Where $\varepsilon_{metal}$ is the dielectric constant of the metal and the $\varepsilon_{diel}$ is the dielectric constant of the material which forms the boundary with the plasmonic material. $\chi$ is a factor which depends on the geometry of the nanoparticle. The value of $\chi$ is 2 for a sphere but will be different for other shapes of particles. For instance, for nanorods with a high aspect ratio the value of $\chi$ could be as large as 20.

This equation shows that materials which possess a negative real and small positive imaginary dielectric constant are capable of supporting surface plasmons. Suitable materials comprise gold, silver and platinum. However the conditions for generating the surface plasmons are only satisfied if the plasmonic material forms a boundary with a material which has a smaller magnitude for the real dielectric constant. In the examples of the disclosure the plasmonic material in the second coating layer 5 forms boundaries 4, 6 with a dielectric material in the inner core 3 and a semiconducting material in second coating layer 7. This enables the surface plasmon resonances to be generated on both the inner and outer surface of the first coating layer 5.

In the examples of the disclosure the composite particle 1 comprises a first boundary 4 between the inner core 3 and the first coating layer 5 and a second boundary 6 between the first coating layer 5 and the second coating layer 7. When the composite particle 1 is illuminated the incident light generates a first surface plasmon at the first boundary 4 and a second surface plasmon at the second boundary 6. The two surface plasmons may interact to provide a single surface plasmon resonance.

The thickness of the first coating layer 5 determines the magnitude of the coupling between the surface plasmons at the different boundaries 4, 6. A thinner shell will provide for increased coupling between the surface plasmons and will effectively red shift the light absorbed by the first coating layer 5. The thickness of the first coating layer 5 may be selected to enable coupling between the surface plasmon generated at the first boundary 4 and the surface plasmon generated at the second boundary 6. This coupling between the surface plasmons on the respective boundaries changes the energy levels of the surface plasmons and effectively tunes the wavelength of light or other electromagnetic radiation that is absorbed by the composite particle 1.

The thickness of the first coating layer 5 may be configured to tune the coupling of the surface plasmons so that the frequency of light absorbed by the first coating layer 5 corresponds to the frequency of light absorbed by the generation of excitons in the second coating layer 7.

Having the multiple coating layers 5, 7 within the composite particle 1 increases the overall absorption cross section of the composite particle 1. The second coating layer 5 can also be configured to tune the frequency of the plasmonic resonance by controlling the thickness of the first coating layer 5 and/or the materials used for the coating layer and/or the shape of the composite particle 1 and/or any other suitable factor.

Improving the absorption of light by the first coating layer 5 also increases the absorption of light by the second coating layer 7. If the resonance of the surface plasmons is tuned to the wavelength for generating excitons this increases the number of excitons produced in the second coating layer 7. The first coating layer 5 acts as a trap for light which then increases the amount of light absorbed by the second coating layer 7. This increases the overall absorption cross section of the composite particle 1 and improves the efficiency of the composite particle 1 at detecting light or other electromagnetic radiation.

The composite particle 1 may be for use in any environment in which light, or other electromagnetic radiation, is to be detected. The composite particle 1 may be suitable for use in a gaseous or liquid environment.

The composite particle 1 may be coupled to any means which may enable the absorption of the light to be detected. In some examples the composite particle 1 may be coupled to a layer of two dimensional material to enable the absorption of light by the composite particle 1 to be detected. In such examples the two dimensional material may be configured to detect a change in the electric field or other properties of the composite particle 1 caused by the absorption of light by the composite particle 1. The two dimensional material could comprise any suitable material such as graphene.

Figure 2:
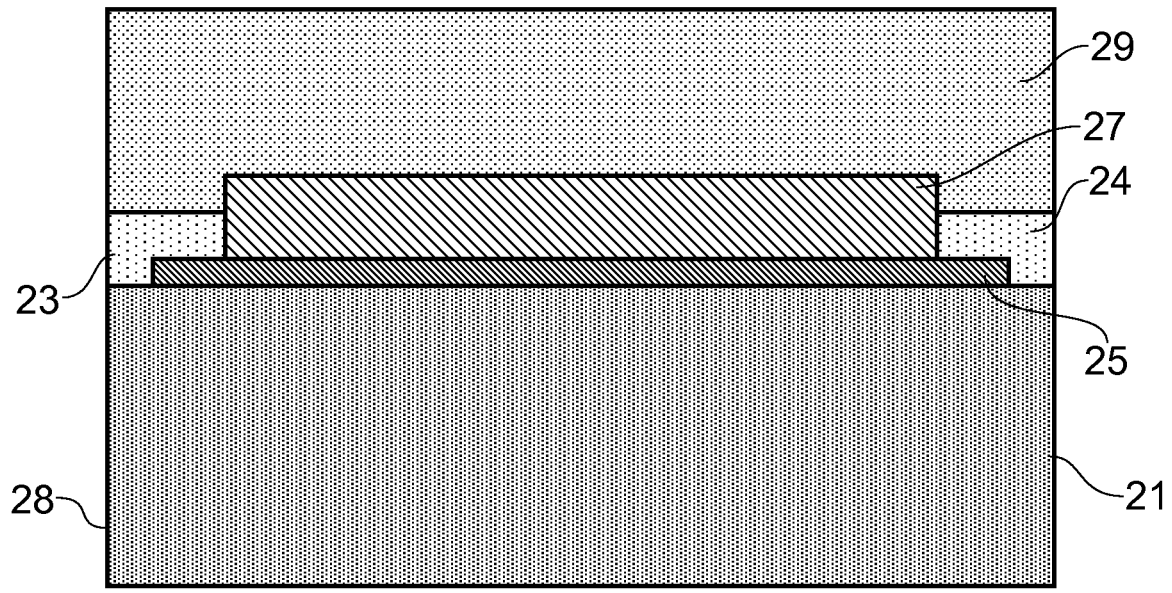
FIG. 2 illustrates an example photodetector comprising composite particles.

FIG. 2 illustrates an example photodetector comprising composite particles 1. In the example of FIG. 2 the photodetector comprises a field effect transistor 21. Other types of photodetector may be used in other examples of the disclosure. For instance the composite particles 1 may be used in any photo-sensitive devices such as photodiodes, photovoltaic devices or any other suitable devices.

The field effect transistor 21 comprises a source electrode 23 and a drain electrode 24 and a graphene channel 25 between the source electrode 23 and the drain electrode 24. The source electrode 23 and the drain electrode 24 may enable direct current to be provided to the graphene channel 25. The electrodes 23, 24 may comprise any suitable conductive material such as copper, gold, indium tin oxide or any other suitable material.

The field effect transistor 21 also comprises a layer 27 of composite particles 1. The layer 27 of composite particles 1 provides a photoactive layer within the field effect transistor 21. The layer 27 may comprise a plurality of composite particles 1. The layer 27 may comprise several million composite particles 1. The layer 27 of composite particles 1 may be several hundred nanometers thick. In some examples the layer 27 of composite particles 1 may be between 5 and 1000 nm thick. In some examples the layer 27 of composite particles 1 may be between 100 and 400 nm thick.

The layer 27 of composite particles 1 is provided overlaying the graphene channel 25. The layer 27 of composite particles 1 may be coupled to the graphene channel 25 so that a change in the electromagnetic field of the composite particles 1 within the layer 27 is detected by the graphene channel 25. The layer 27 of composite particles 1 may be arranged to act as a gate electrode for the graphene channel 25.

In some examples the composite particles 1 may be coupled to the graphene channel 25 so that charges generated by incident light are transferred to the graphene channel 25. This increases the number of charge carriers within the graphene channel 25 and so increases the conductivity of the graphene channel 25. In some examples the absorption of the incident light may result in a change in the electric field of the composite particle 1. The composite particles 1 may be positioned so that this change in electric field may affect the mobility of charges within the graphene channel 25 and so may produce a detectable change in the conductivity of the graphene channel 25.

In the example of FIG. 2 the field effect transistor 21 also comprises a substrate 28. The substrate 28 may support the source electrode 23, drain electrode 24 and the graphene channel 25. The substrate 28 may also support connections to the source electrode 23 and drain electrode 24. Other components may be provided on the substrate 28. The substrate 28 may comprise an insulating material such as glass or polymer or any other suitable material.

In the example of FIG. 2 the field effect transistor 21 also comprises a passivation layer 29. The passivation layer 29 may be configured to coat the transistor 21 and protect it from environmental parameters. The passivation layer 29 may encapsulate the components of the transistor 21. The passivation layer 29 may be transparent to the light, or other electromagnetic radiation, which is to be detected. For instance, in the example of FIG. 2 the passivation layer 29 may allow visible light to pass through but may be configured to prevent fluids or other contaminants from reaching the transistor 21.

In the example of FIG. 2 the field effect transistor 21 comprises a graphene channel 25. Other materials may be used for the channel in other examples of the disclosure.

When light, or other electromagnetic radiation is incident upon the transistor 21 this causes absorption of light by the composite particles 1 within the layer 27. This causes the generation of excitons within the second coating layer 7. The generation of excitons within the second coating layer 7 is enhanced by the inner core 3 and first coating layer 5. The electron hole pair may be split so that one of the charges preferentially conducts within the composite particle 1 while the other charge conducts with a slower mobility. The electric field within the field effect transistor 21 may promote the transport of one charge compared to the other.

The layer 27 of composite particles 1 is arranged to enable charge to be transferred to the graphene channel 25. As graphene has a high charge mobility this enables the charge to be transferred through the graphene channel 25 before recombination can occur. This charge transfer causes a change in the current within the graphene channel 25. In some examples the charge transfer may increase the number of dominant charge carriers within the graphene channel 25. In some examples the charge transfer may cause recombination with the dominant charge carrier in the graphene channel 25 which may decrease the number of dominant charge carriers.

The remaining charge from the excitons is trapped within the composite particle 1 and acts to change the electric field around the composite particle 1. This change in the electric field also changes the conductivity of the graphene channel 25.

The generation of the surface plasmons within the first coating layer 5 may also change the electric field around the composite particle 1. This change in the electric field may also be detected as a change in the conductivity of the graphene channel 25.

Figure 3:
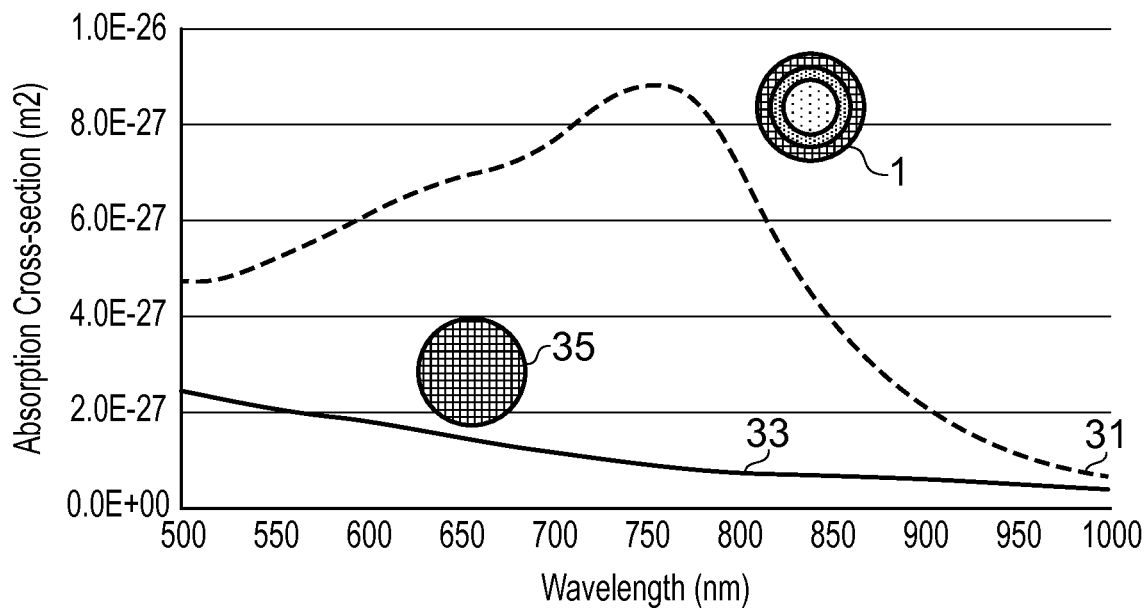
FIG. 3 illustrates a plot of light absorbed by example composite particles.

FIG. 3 illustrates absorption spectra for an example composite particle 1. The plot of FIG. 3 shows a plot 31 of a composite particle 1 according to examples of the disclosure in comparison with a plot 33 of a PbS particle 35.

To obtain the data of FIG. 3 the composite particle 1 was spherical and comprised an inner core 3 comprising polystyrene and having a radius of 3 nm. The first coating layer 5 comprised a gold layer which was 3 nm thick. The outer coating layer 7 comprised PbS and was 2 nm thick. This gave the composite particle 1 an overall radius of 8 nm. Other dimensions and materials for the composite particle 1 could be used in other examples of the disclosure.

To obtain the data for the plot in FIG. 3 the PbS particle 35 had the same outer radius as the composite particle 1 and both of the particles 1, 35 were spherical.

The plots 31, 33 show a significant increase in the absorption cross section for the composite particle compared to the solid PbS particle 35.

FIG. 3 shows no discernible absorption peak in the plot 33 for the solid PbS particle 35. This is not the case for the plot 31 of the composite particle 1 which shows a strong absorption peak at a wavelength of approximately 750 nm. The improved absorption may be a direct result of the interaction between the surface plasmons on the first boundary 4 and the surface plasmons on the second boundary 6. The wavelength of the absorption peak could be tuned by modifying the dimensions of any one or more of the inner core 3, the first coating layer 5 or the second coating layer 7 or the materials used for any of these layers or the shape of the composite particle 1.

FIG. 3 does not show any absorption peak due to excitons. To obtain the data for the plots of FIG. 3 the absorption cross-sections were calculated using the classical physics behavior of the PbS, polystyrene and Au dielectric properties alone. There was no consideration of the excitation of the quantum mechanical exciton in the PbS. If such mechanism were taken into account this would produce a small exciton peak at a wavelength above 1000 nm. These wavelengths are not included in the plot of FIG. 3.

Figure 4:
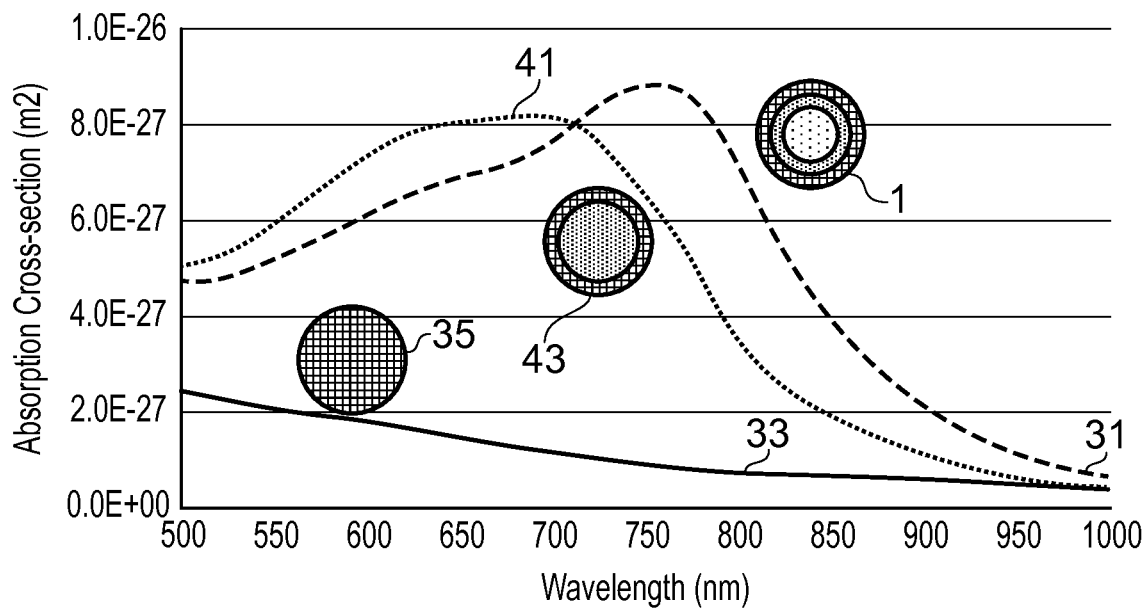
FIG. 4 illustrates another plot of light absorbed by example composite particles.

FIG. 4 illustrates another absorption spectra for an example composite particle 1. The plot of FIG. 4 shows a plot 31 of a composite particle 1 according to examples of the disclosure in comparison with a plot 33 of a PbS particle 35. The plots 31, 33 may be the same as the plots illustrated in FIG. 3 and corresponding reference numerals have been used.

FIG. 4 also shows a plot 41 for another particle 43 comprising a gold core 45 and a PbS outer coating 47. To obtain the data used in FIG. 4 the gold core 45 was spherical and had a radius of 6 nm and the PbS outer coating 47 had a thickness of 2 nm. This gave the particle 43 an overall radius of 8 nm which is the same as the radius for the composite particle 1 and the PbS particle 33.

The plot 41 for the particle 43 has an absorption peak between 600 and 700 nm. The peak in the plot 41 is smaller than the peak in the plot 31 for the composite particle 1. Therefore it can be seen that the composite particle structure of the examples of the disclosure of the invention increases the absorption of the particles. This also shows that the composite particle shifts the wavelength at which the peak occurs. This structure of the composite particle enables the wavelength at which the absorption peak occurs to be controlled.

Figure 5:
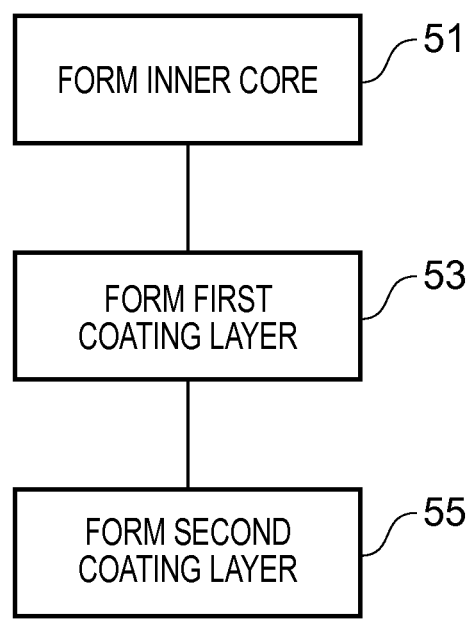
FIG. 5 illustrates a method.

FIG. 5 illustrates a method which may be used to form a composite particle 1 as described above. The method comprises, at block 51, forming an inner core 3 comprising a dielectric material. The method also comprises, at block 53, forming a first coating layer 5 overlaying the inner core 3 and at block 55 forming a second coating layer 7 overlaying the first coating layer 5 where the second coating layer 5 comprises a semi-conductor material. The first coating layer 5 comprises a plasmonic material configured to enable surface plasmons to be generated at a boundary 4 between the inner core 3 and the first coating layer 5 and a boundary 6 between the first coating layer 5 and the second coating layer 7.

Examples of the disclosure provide a composite particle 1 which can be used to detect light or other electromagnetic radiation. The composite structure as described above improves the overall absorption efficiency of the nanoparticle. The composite structure also allows for tuning of the resonance of the surface plasmons which tunes the frequency of light, or other electromagnetic radiation, that is detected.

The increase in the absorption cross section effectively traps more light within the composite particle and so increases the absorption of light by the second coating layer 7. This increases the amount of excitons created in the second coating layer 7. The creation of excitons may be improved by tuning the plasmon resonance to correspond to the exciton generation wavelength of the second coating layer 7.

As the composite particle 1 comprises an inner core 3 which could comprise a dielectric material such as polystyrene this reduces the volume of metals such as gold, silver and platinum which are required.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this detailed description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A composite particle comprising:
an inner core comprising a dielectric material;
a first coating layer provided overlaying at least part of the inner core;
a second coating layer provided overlaying the first coating layer where the second coating layer comprises a semi-conductor material and is configured to generate excitons in response to incident light, wherein the thickness of the second coating layer inhibits a recombination of excitons with the semiconductor material; and
wherein the first coating layer comprises a plasmonic material configured to enable surface plasmons to be generated at a boundary between the inner core and the first coating layer and a boundary between the first coating layer and the second coating layer.

2. A composite particle as claimed in claim 1 wherein the thickness of the first coating layer enables coupling between surface plasmons generated at the boundary between the inner core and the first coating layer and surface plasmons generated at the boundary between the first coating layer and the second coating layer.

3. A composite particle as claimed in claim 2 wherein the thickness of the first coating layer is configured to tune the coupling of the surface plasmons so that the frequency of light absorbed by the first coating layer corresponds to the frequency of light absorbed by the second coating layer.

4. A composite particle as claimed in claim 1 wherein the second coating layer forms the outer surface of the composite particle.

5. A composite particle as claimed in claim 1 wherein the inner core comprises a material which does not absorb incident light.

6. A composite particle as claimed in claim 1 wherein the inner core comprises polystyrene.

7. A composite particle as claimed in claim 1 wherein the first coating layer comprises a metal.

8. A composite particle as claimed in claim 1 wherein the composite particle is spherical.

9. An apparatus comprising
at least one composite particle and a layer of two dimensional material wherein the at least one composite particle is coupled to the layer of two dimensional material to enable absorption of light by the composite particle to be detected by the layer of two dimensional material;
wherein the composite particle comprising: an inner core comprising a dielectric material;
a first coating layer provided overlaying at least part of the inner core;
a second coating layer provided overlaying the first coating layer where the second coating layer comprises a semi-conductor material; and
wherein the first coating layer comprises a plasmonic material configured to enable surface plasmons to be generated at a boundary between the inner core and the first coating layer and a boundary between the first coating layer and the second coating layer.

10. An apparatus as claimed in claim 9 wherein the two dimensional material is configured to detect a change in the electric field of the composite particle caused by the absorption of light.

11. An apparatus as claimed in claim 9 wherein the two dimensional material forms a channel within a field effect transistor.

12. An apparatus as claimed in claim 9 wherein the two dimensional material comprises graphene.

13. An apparatus as claimed in claim 9, wherein the apparatus is part of a photodetector.

14. A method comprising:
   forming an inner core comprising a dielectric material;
   forming a first coating layer overlaying at least part of the inner core;
   forming a second coating layer overlaying the first coating layer where the second coating layer comprises a semi-conductor material and is selected to generate excitons in response to incident light, wherein the selected thickness of the second coating layer inhibits a recombination of excitons with the semiconductor material; and
   wherein the first coating layer comprises a plasmonic material configured to enable surface plasmons to be generated at a boundary between the inner core and the first coating layer and a boundary between the first coating layer and the second coating layer and wherein the inner core, first coating layer and second coating layer form a composite particle.

15. A method as claimed in claim 14 wherein the thickness of the first coating layer enables coupling between surface plasmons generated at the boundary between the inner core and the first coating layer and surface plasmons generated at the boundary between the first coating layer and the second coating layer.

16. A method as claimed in claim 15 wherein the thickness of the first coating layer is configured to tune the coupling of the surface plasmons so that the frequency of light absorbed by the first coating layer corresponds to the frequency of light absorbed by the second coating layer.

17. A method as claimed in claim 14 wherein the second coating layer forms the outer surface of the composite particle.

18. A method as claimed in claim 14 wherein the second coating layer is configured to generate excitons in response to incident light.

19. A method as claimed in claim 14 wherein the inner core comprises a material which does not absorb incident light.

* * * * *